United States Patent

Wojewoda et al.

[11] Patent Number: 6,057,705
[45] Date of Patent: May 2, 2000

[54] PROGRAMMABLE PIN DESIGNATION FOR SEMICONDUCTOR DEVICES

[75] Inventors: Igor Wojewoda; Rodney J. Drake, both of Phoenix; Brian E. Boles, Mesa, all of Ariz.

[73] Assignee: Microchip Technology Incorporated, Chandler, Ariz.

[21] Appl. No.: 09/085,826

[22] Filed: May 28, 1998

[51] Int. Cl.[7] ............................. G06F 7/38; H03K 19/173
[52] U.S. Cl. ................................................. 326/38; 326/37
[58] Field of Search .................................. 326/38, 37, 39, 326/40

[56] References Cited

U.S. PATENT DOCUMENTS

| | | |
|---|---|---|
| 4,495,603 | 1/1985 | Varshney . |
| 5,233,539 | 8/1993 | Agrawal et al. ........................ 364/489 |
| 5,473,758 | 12/1995 | Allen et al. . |
| 5,504,439 | 4/1996 | Tavana ...................................... 326/38 |
| 5,594,367 | 1/1997 | Trimberger et al. ...................... 326/38 |
| 5,686,844 | 11/1997 | Hull et al. . |
| 5,744,980 | 4/1998 | McGowan et al. ........................ 326/40 |
| 5,811,985 | 9/1998 | Trimberger et al. ...................... 326/38 |

*Primary Examiner*—Michael Tokar
*Assistant Examiner*—Daniel D. Chang
*Attorney, Agent, or Firm*—Ronald L. Chichester; Paul N. Katz; Frohwitter

[57] ABSTRACT

The invention allows the programmer to designate one or more pins on a semiconductor device as either address pins, which are in addition to a predetermined set of address lines or as alternate I/O pins. The object of the invention is to provide the programmer with the capability of defining with preciseness the particular size of the address bus needed for a specific application. The invention is comprised of a programming port, optional programming logic, configuration logic, selection logic and a set of pins that may be configured as per the programmer's requirements. The invention is to exist on a single, monolithic semiconductor device.

7 Claims, 3 Drawing Sheets

PROGRAMMABLE PIN DESIGNATION FOR SEMICONDUCTOR DEVICES

BACKGROUND OF THE INVENTION

Field of the Invention

This invention relates generally to semiconductor device pin designation. Specifically, the present invention relates to the ability of the user to programmably designate one or more semiconductor device pins to perform an expanded and flexible set of address functions, as well as other I/O functions.

Description of the Prior Art

The current state of the art describes semiconductor devices such as microprocessors and microcontrollers that have bi-directional I/O ports to a common pin that are capable of performing one function when in the input mode and a second function when in the output mode.

The current state of the art also describes semiconductor devices such as microprocessors and microcontrollers that are capable of using a particular pin as either an address pin or a data pin, depending on state of the device with respect to the memory access cycle. For example, a microprocessor capable of driving a 16 bit wide data bus is likely to have 16 pins that function as data I/O. The microprocessor has an internal capability that allows the same 16 pins to drive an address bus. If additional addressing capability is needed, then additional pins must be dedicated to fulfill this need. Under the prior art, the internal architecture of address pin assignments is defined by the semiconductor manufacturer and cannot be modified by the user.

The prior art, as found in U.S. Pat. No. 5,686,844, "INTEGRATED CIRCUIT PINS CONFIGURABLE AS A CLOCK INPUT PIN AND AS A DIGITAL I/O PIN OR AS A DEVICE RESET PIN AND AS A DIGITAL I/O PIN AND METHOD THEREFOR," describes semiconductor devices with the capability of configuring integrated circuit (IC) pins as clock/reset signals or other digital I/O.

Other schemes have described a multifunctional pin approach for test circuits, which purport to test multiple segments of memory simultaneously. See U.S. Pat. No. 4,495,603, "TEST SYSTEM FOR SEGMENTED MEMORY." However, this prior art describes the introduction of a "logic box" which contains little more than tri-state buffers that generate read and write test clocks for segmented memory devices. Furthermore, there is no suggestion that these test circuits or "logic boxes" are integral to the processing unit and thus are not programmable for customizing the I/O function of the processing unit.

U.S. Pat. No. 5,473,758, "SYSTEM HAVING INPUT OUTPUT PINS SHIFTING BETWEEN PROGRAMMING MODE AND NORMAL MODE TO PROGRAM MEMORY WITHOUT DEDICATING INPUT OUTPUT PINS FOR PROGRAMMING MODE," claims a common set of processing unit I/O pins to function in either a programming mode (e.g. programming non-volatile memory) or a normal mode (e.g. executing program memory).

Thus, a problem is created that manifests itself as either insufficient or excessive addressing capability, depending on the programmer's application. Furthermore, the prior art does not anticipate a flexible addressing capability that may be programmed for the specific application of the semiconductor device.

Therefore, a need existed to provide a semiconductor device where the number of address pins required to meet the design specification may be programmably designated.

SUMMARY OF THE INVENTION

It is an object of the present invention to provide a system that will permit the user to designate the function of one or more semiconductor device pins.

It is another object of the present invention to provide a system that will permit the user to program the designation of semiconductor device pins as either address pins or standard I/O pins.

It is another object of the present invention to provide a system that will allow the user to permanently program a semiconductor device for the purpose of designating the function of the semiconductor device pins.

It is another object of the present invention to provide a system that will allow the user to alterably program a semiconductor device for the purpose of designating the function of the semiconductor device pins.

It is another object of the present invention to provide a system that is capable of encoded designation of semiconductor device pins.

It is still another object of the present invention to provide a system that is capable of non-encoded designation of semiconductor device pins.

In accordance with one embodiment of the present invention, a system for programmably designating semiconductor pins comprises a programming port, configuration logic, selection logic and at least one pin, which may be programmably designated to perform one of a plurality of I/O functions. This embodiment may further comprise a plurality of semiconductor pins, which are predesignated and unalterable, to perform memory address functions. Furthermore, in this embodiment, the above elements and features are co-located on a single, monolithic semiconductor device.

In accordance with another embodiment of the present invention, a system for programmably designating semiconductor pins comprises a programming port, programming logic, configuration logic, selection logic and at least one pin which may be programmably designated to perform one of a plurality of I/O functions. This embodiment may further comprise a plurality of semiconductor pins, which are predesignated and unalterable, to perform memory address functions. This embodiment may further comprise of decoding pin designation assignments from an encoded format. Furthermore, in this embodiment, the above elements and features are co-located on a single, monolithic semiconductor device.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENT

Figure 1:
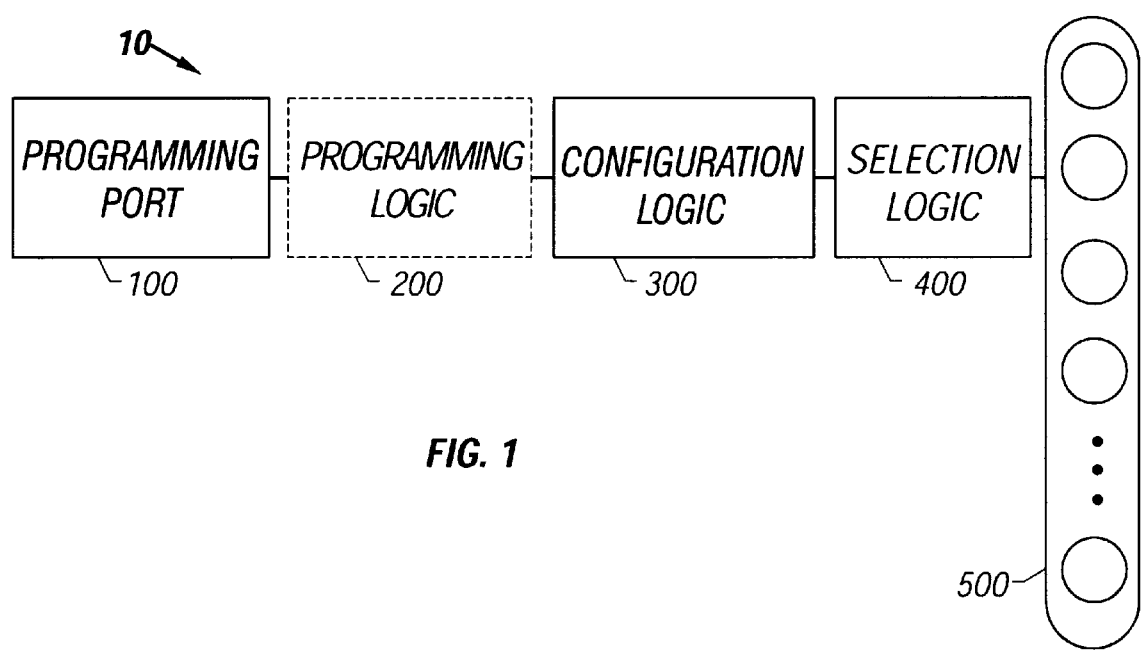
FIG. 1 is a block diagram of the present invention.
Figure 4:
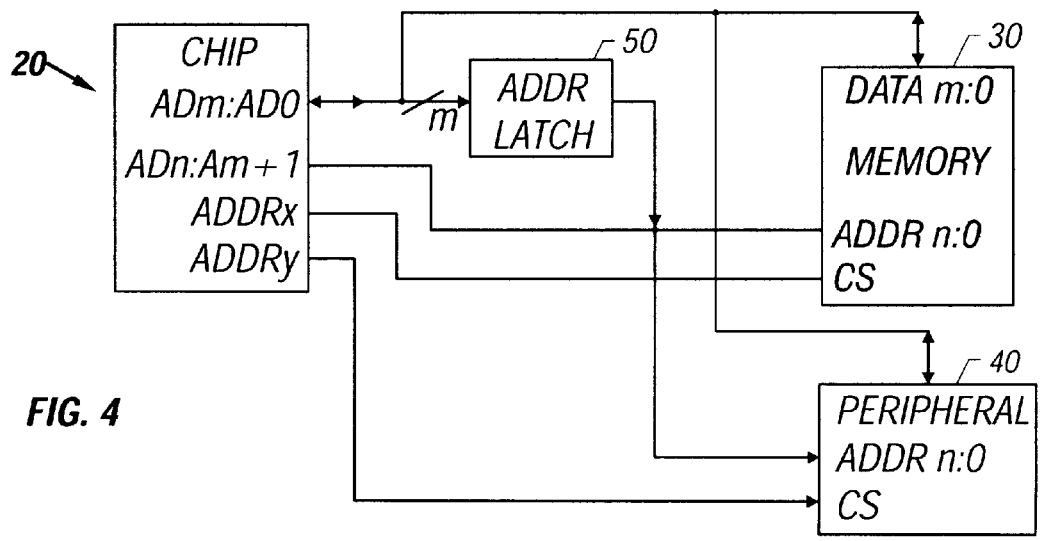
FIG. 4 is a diagram of an application of the present invention illustrating expanded address functions and chip select.

Referring to FIG. 1, a block diagram of the present invention 10 is shown. The programmable pin designation for semiconductor devices 10 [hereinafter "system"] is comprised of a programming port 100, optional programming logic 200 (shown in dashed lines to indicate an optional, not a required, element), configuration logic 300, selection logic 400 and at least one pin 500, which may be programmably designated to perform one of a plurality of I/O functions. The system is further comprised of a plurality of semiconductor pins which are predesignated and unalterable, to perform a memory address function. These pins are shown in FIG. 4 as $AD_m:AD_0$, which is a diagram demonstrating several applications of the invention. In the preferred embodiment, the elements described above are co-located on a single, monolithic semiconductor device.

The importance of the invention is to provide a semiconductor device such as a microcontroller, microprocessor or other devices capable of performing memory access with a flexible, programmable method of selecting the precise address range required for the application. The objective of the invention is to optimize the number of semiconductor pins needed for memory address functions and quasi-address functions such as chip select.

The programming port 100 may be either a serial or parallel I/O port of various formats, standards and protocols which are well known to those skilled in the art. The programming port has several functions. The port 100 accepts semiconductor pin configuration data from a programming device that is beyond the scope of the invention, but is well known to those skilled in the art of computer science. The port 100 may also output the current configuration of the semiconductor pins to external devices. Also, the port 100 may be used for test purposes.

In one embodiment, the configuration data is transmitted via the programming port directly to the configuration logic 300 where it is stored. In an alternative embodiment, the configuration data is read by the programming logic 200, which may be a processing unit. The configuration data is interpreted by the programming logic 200. The interpretted form of the configuration data is stored in the configuration logic 300.

The configuration logic 300 may include one of a number of implementations. In one embodiment, the configuration logic 300 may be a simple register or a location within a programmable volatile or non-volatile memory array. Thus, in this embodiment, the configuration data stored in the configuration logic may be modified at the discretion of the programmer. Alternatively, the configuration logic may encompass one time only programmable logic such as a programmable read only memory (PROM) or other types of fusible devices known to those skilled in the art.

Figure 2:
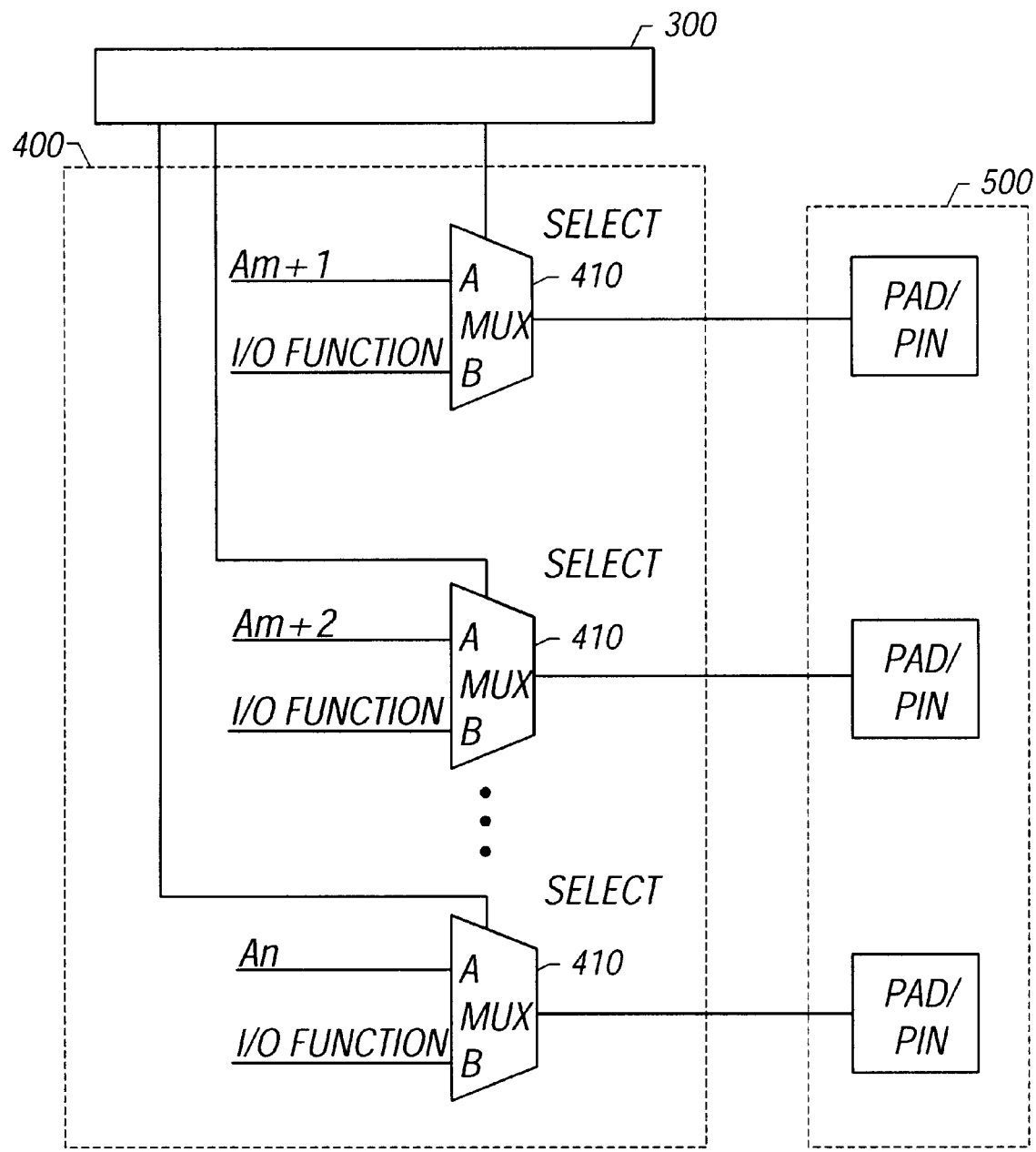
FIG. 2 is a diagram of one embodiment of the selection logic.
Figure 3:
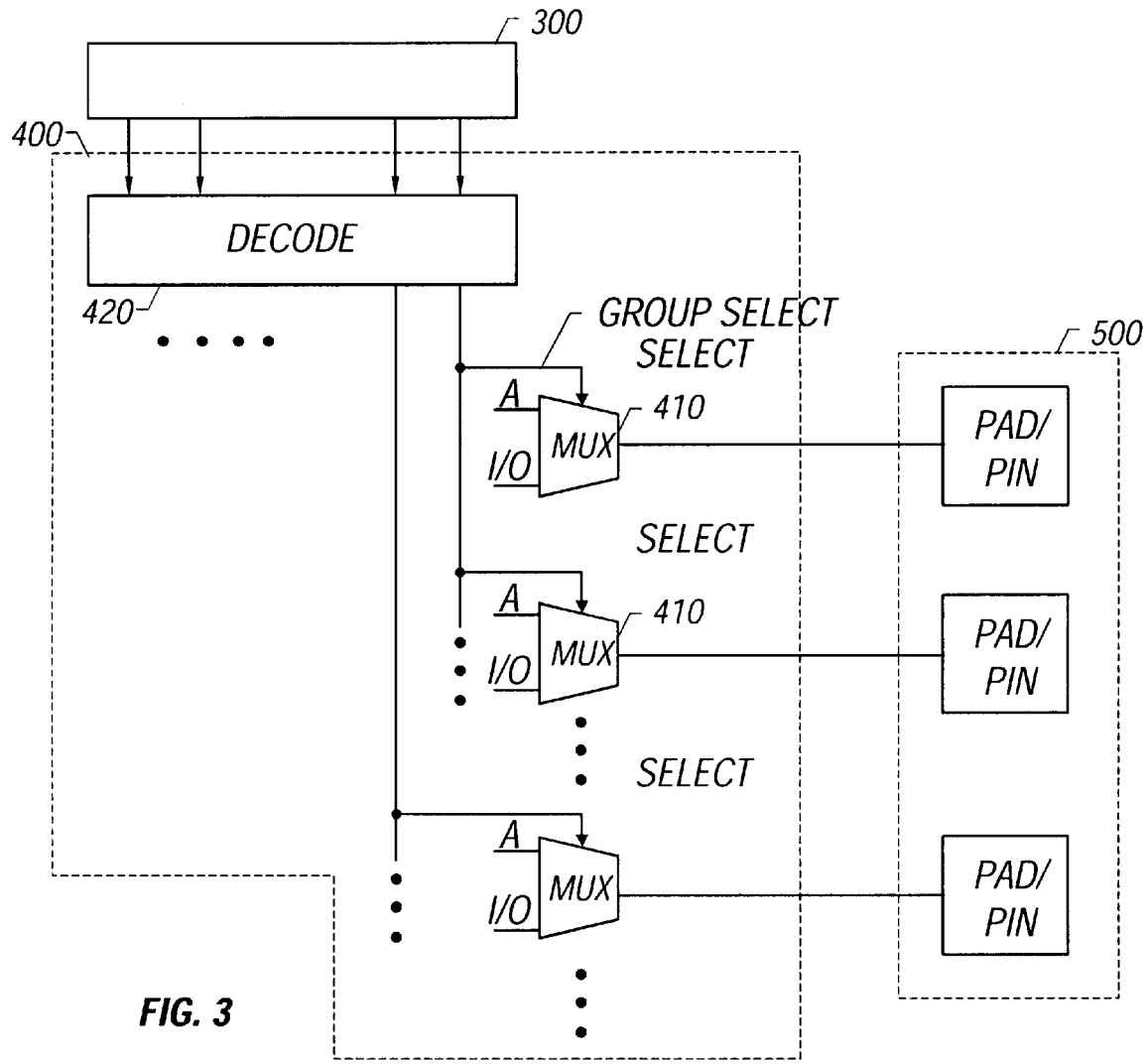
FIG. 3 is a diagram of another embodiment of the selection logic with decoding capability.

Referring to FIGS. 1, 2, and 3, wherein like numerals represent like elements, the selection logic 400 is shown. The selection logic provides the decision mechanism for designating semiconductor pin functions. The selection logic 400 is comprised of a series of multiplexers 410 in the preferred embodiment. In another embodiment, the selection logic includes both the series of multiplexers 410 and one or more decoders 420.

FIG. 1 shows that the selection logic 400 provides the bridge between the data stored in the configuration logic 300 and the semiconductor pins 500. FIG. 2 shows a non-encoded form of the selection logic 400 where there is one to one mapping between each bit of the configuration logic 300 and the select input for each multiplexer 410. FIG. 3 shows an encoded form of the selection logic 400 where the configuration data is stored in an encoded format. The encoded data is then decoded by decode logic 420 and then coupled to the select inputs of the multiplexers 410.

The inputs of the multiplexers 410 are either expanded address lines or other I/O functions performed by a semiconductor device. The outputs of the multiplexers 410 are connected to the semiconductor pins 500, either directly or through a buffer.

Referring to FIG. 4, a typical application of the present invention 10 is shown. The present invention 10 is embodied in block 20, which represents a processing unit such as a microprocessor or microcontroller. The application also illustrates memory device 30 and peripheral device 40. The address latch 50 is also illustrated.

$AD_m:AD_0$ in block 20 represents a predesignated set of pins with an address function. In this example, these pins may be coupled to the data bus in addition to driving the address bus. However, in other embodiments the predesignated set of address pins may not be multiplexed with the data bus function, thus obviating the requirement for the address latch 50. The predesignated nature of the address function of the semiconductor pins corresponding to $AD_m:AD_0$ may not be altered or modified by the programmer.

The memory device 30 and peripheral device 40 have addressable memory locations which exceed that provided for by the range defined by $AD_m:AD_0$. Therefore, addition memory addressing capability is required. The programmer defines the expanded addressing as $A_n:A_{m+1}$, where $n \geq m+1$. This data is stored in the configuration logic 300 and the selection logic 400 determines the semiconductor pin 500 assignments (FIGS. 1–3).

Also in this application, because there may be redundancy in addressable memory locations as between memory device 30 and peripheral device 40, chip select logic is shown. Chip select logic is represented in block 20 as $ADDR_x$ and $ADDR_y$. By designating these pins as chip selects in the same manner as described above for expanded address pins, the appropriate memory/peripheral device is accessed. Thus, the present invention allows for flexible designation of IC pins for addressing, which precisely matches the addressing requirements of the design specification. Those pins not used for addressing are available for other I/O functions.

Although the invention has been particularly shown and described with reference to a preferred embodiment thereof, it will be understood by those skilled in the art that changes in form and detail may be made therein without departing from the spirit and scope of the invention.

What is claimed is:

1. A system for programmably designating semiconductor device pins comprising, in combination:

a programming port for receiving a plurality of pin designation instructions;

configuration logic coupled to the programming port for storing the plurality of pin designation instructions;

selection logic coupled to the programming port for selecting the function of at least one pin designation;

at least one pin coupled to the selection logic and that is programmably designated to perform one of a plurality of I/O functions;

a plurality of pins with a predesignated address function; and programming logic coupled to the programming port for interpreting the plurality of pin designation instructions.

2. The system in accordance with claim 1 wherein the programming port, the configuration logic, the selection logic, the at least one pin and the plurality of pins with the predesignated address function are all located on a single, monolithic semiconductor device.

3. The system in accordance with claim 1 wherein the programming logic is comprised of a processing unit that interprets the plurality of pin designation instructions and stores a plurality of pin designation commands within the configuration logic.

4. The system in accordance with claim 3 wherein the plurality of pin designation commands are encoded commands.

5. The system in accordance with claim 1 wherein the selection logic is comprised of at least one multiplexer.

6. The system in accordance with claim 5 wherein the selection logic is further comprised of decoding logic for decoding the plurality of pin designation commands.

7. A method for programmably designating semiconductor pins comprising the steps of:

providing a plurality of pin designation instructions to a programming port;

providing at least one configuration register to store the plurality of pin designation instructions received from the programming port;

providing selection logic that is controlled by the pin designation instructions stored in the at least one configuration register for selecting one of a plurality of I/O functions;

providing at least one pin coupled to the selection logic and that is programmably designated to perform one of the plurality of I/O functions;

providing a plurality of pins with a predesignated address function; and providing programming logic coupled to the programming port for interpreting the plurality of pin designation instructions.

* * * * *